(12) United States Patent
Kato

(10) Patent No.: US 7,309,627 B2
(45) Date of Patent: Dec. 18, 2007

(54) METHOD FOR FABRICATING A GATE MASK OF A SEMICONDUCTOR DEVICE

(75) Inventor: Osamu Kato, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 120 days.

(21) Appl. No.: 11/231,820

(22) Filed: Sep. 22, 2005

(65) Prior Publication Data
US 2006/0014341 A1    Jan. 19, 2006

Related U.S. Application Data

(62) Division of application No. 10/689,032, filed on Oct. 21, 2003, now abandoned.

(30) Foreign Application Priority Data
Oct. 23, 2002  (JP) .............................. 2002-308767

(51) Int. Cl.
*H01L 21/336*  (2006.01)
(52) U.S. Cl. ...................... 438/197; 438/200; 438/239; 438/243; 438/244; 438/253; 438/254; 438/255; 438/257; 257/E21.293
(58) Field of Classification Search .............. 438/244, 438/254, 255
See application file for complete search history.

(56) References Cited

U.S. PATENT DOCUMENTS

2002/0081794 A1 *  6/2002 Ito .............................. 438/200
2002/0119648 A1    8/2002 Inoue et al.

FOREIGN PATENT DOCUMENTS

JP    5029301    2/1993
JP    5171443    7/1993

* cited by examiner

*Primary Examiner*—Michael Lebentritt
*Assistant Examiner*—Kyoung Lee
(74) *Attorney, Agent, or Firm*—Rabin & Berdo, PC

(57) ABSTRACT

A nitride layer of the gate mask for the semiconductor device is deposited at a temperature higher than 750 deg. C so as to release hydrogen from the nitride layer. Alternatively, a nitride layer of the gate mask for the semiconductor device is deposited in a gas atmosphere with use of an ammonia gas and a silane gas such that a flow rate of the ammonia gas is set at least twenty times or greater than that of the silane gas. Accordingly, the problem with respect to the threshold voltages Vt of the semiconductor devices varying greatly from device to device when the polysilicon layer or the amorphous silicon layer is formed in the vicinity of the nitride layer and is doped with Group III impurities, will be solved.

2 Claims, 7 Drawing Sheets

METHOD FOR FABRICATING A GATE MASK OF A SEMICONDUCTOR DEVICE

BACKGROUND OF THE INVENTION

This is a Divisional of U.S. Application Ser. No.:10/689,032, filed Oct. 21, 2003 now abandoned, the subject matter of which is incorporated herein by reference.

1. Field of the Invention

The present invention relates to a method for fabricating a gate mask of a semiconductor device, and particularly to a method for fabricating a gate mask of a semiconductor device that is configured to form a polysilicon layer or an amorphous silicon layer on a silicon substrate and to be doped into such a layer with an impurity.

2. Description of the Related Art

A semiconductor device that is configured to form a polysilicon layer or an amorphous silicon layer on a silicon substrate and to be doped into such a layer with an impurity has been employed in the prior art. An example of a process for forming such semiconductor devices will be described hereinafter.

Firstly, a gate insulator layer is deposited on a silicon substrate, and a polysilicon layer or an amorphous silicon layer is deposited thereon. The following description will be made hereinafter based on the assumption that the polysilicon layer is employed.

Next, a PMOS section and an NMOS section are formed on the polysilicon layer by the following procedure as an example.

A mask is firstly formed by a photoresist material on the polysilicon layer to cover a region which is not used for the PMOS section, so that a region used for the PMOS section is exposed. Then, such an exposed region, i.e. a region used for the PMOS section, is doped with Group III impurities such as boron by means of ion implantation. The mask is then removed. Accordingly, the PMOS section is formed on the polysilicon layer.

Another mask is then formed by a photoresist material on the polysilicon layer to cover a region which is not used for the NMOS section, so that a region used for the NMOS section is exposed. Then, such an exposed region, i.e. a region used for the NMOS section, is doped with Group V impurities such as phosphorus by means of ion implantation. The mask is then removed in turn. Accordingly, the NMOS section is formed on the polysilicon layer. It should be noted that a forming sequence of the PMOS section and the NMOS section is arbitrarily determined depending on the structure of the semiconductor device.

A heat treatment is then made in order to activate impurity ions which were doped. An oxide film which is formed over the polysilicon layer during the heat treatment is required to be removed.

A tungsten silicide (WSix) layer is then deposited on the polysilicon layer when necessary, thereafter, a nitride layer is deposited thereon.

The nitride layer is then fabricated into an arbitrary pattern. Thereafter, a region of the tungsten silicide layer and the polysilicon layer which is not covered by the nitride layer is removed by etching.

In the aforementioned method, a gate structure of the semiconductor device is formed with an arbitrary pattern.

In the aforementioned fabrication process, the deposition process of the nitride layer is normally carried out at a temperature of 750 deg. C. Because of a subsequent heat treatment for the activation of the source and the drain, some hydrogen atoms which remain in the nitride layer penetrate the tungsten silicide layer, and then diffuse into the polysilicon layer. These hydrogen atoms which have diffused in the polysilicon layer can affect the Group III impurities such as boron which was doped in the polysilicon layer. Specifically, the hydrogen atoms result in a acceleration of the diffusion rate of the Group III impurities. As a result, the Group III impurities may diffuse until they reach the gate insulator layer, and may penetrate the polysilicon layer. For this reason, the threshold voltages Vt vary greatly from device to device when the semiconductor devices are configured to form the polysilicon layer or the amorphous silicon layer which is doped with Group III impurities, in the vicinity of the nitride layer. Consequently, the semiconductor devices pose a reliability problem when the polysilicon layer or the amorphous silicon layer is formed in the vicinity of the nitride layer and doped with Group III impurities. Such a problem is frequently seen in semiconductor devices such as CMOS devices, in particular, in dual gate CMOS devices.

With regard to the fabrication method of the semiconductor devices, a number of techniques to control the amount of hydrogen are disclosed.

For example, a deposition technique using a gas which does not contain hydrogen bond is disclosed (reference is, for example, made to Japanese Patent Laid-open No. 5-29301).

Alternatively, a technique for the deposition of the nitride layer by controlling a flow rate ratio of $NH_3$ to $SiH_4$ and a flow rate ratio of $N_2$ to $SiH_4$ in the range of 2-10 and 13-17, respectively, is disclosed (references are, for example, made to Japanese Patent Laid-open No. 5-29301 and Japanese Patent Laid-open No. 5-171443).

According to the technique disclosed in Japanese Patent Laid-open No. 5-29301, an example which uses a $N_2$ gas for the deposition of the insulator layer (the nitride layer) is described. Such example described in the above patent document, however, poses a problem of low deposition rate in the nitride layer formation, since $N_2$ is hardly decomposed. Moreover, processing of $N_2$ requires not only the use of technologies such as plasma, but also a process condition at an ultra-high temperature that is 800 deg. C. or more. For this reason, it is necessary that the fabrication unit of the semiconductor device satisfies processing conditions requiring a mechanism to generate plasma and maintaining ultra-high temperature. Consequently, the fabrication unit of the semiconductor device according to the technique disclosed in Japanese Patent Laid-open No. 5-29301 pose a problem requiring a complicated fabrication unit.

According to the technique disclosed in Japanese Patent Laid-open No. 5-171443, a nitride silicon layer having fewer dangling bonds is obtained by increasing the amount of hydrogen in the gas phase so as to bind hydrogen atoms with the dangling bonds of silicon atoms and nitrogen atoms. However, according to the disclosed technique in Japanese Patent Laid-open No. 5-171443, the diffusion of hydrogen atoms from the nitride layer into the polysilicon layer or the amorphous silicon layer is not taken into account. In the disclosed technique in Japanese Patent Laid-open No. 5-171443, a diffusion rate of Group III impurities such as boron is, therefore, increased by hydrogen which has diffused in the polysilicon layer or the amorphous silicon layer, thus the impurities may diffuse until they reach the gate insulator layer and may penetrate the polysilicon layer. As a result, the threshold voltages Vt of the semiconductor devices vary greatly from device to device when the polysilicon layer or the amorphous silicon layer is formed in the vicinity of the nitride layer and is doped with Group III impurities. Consequently, the semiconductor devices result in low reliability when the polysilicon layer or the amorphous silicon layer is formed in the vicinity of the nitride layer and is doped with Group III impurities.

3. Object and Advantage of the Invention

Accordingly, it is an object of the present invention to provide a fabrication method of a semiconductor device with improved reliability by reducing the amount of hydrogen atoms remaining in the nitride layer so that each threshold voltage Vt of the fabricated semiconductor device does not deviate with respect to each device, wherein the semiconductor devices are configured to form the polysilicon layer or the amorphous silicon layer, which is doped with Group III impurities, in the vicinity of the nitride layer.

4. Summary of the Invention

In order to solve the aforementioned problems, a method for fabricating a gate mask of a semiconductor device according to one feature of the present invention is characterized in that a nitride layer of the gate mask for the semiconductor device is deposited at a temperature over 750 deg. C. so as to release hydrogen from the nitride layer. Accordingly, hydrogen can be released from the nitride layer, thereby the amount of hydrogen atoms remaining in the nitride layer can be reduced.

A method for fabricating a gate mask of a semiconductor device according to another feature of the present invention is characterized in that a nitride layer of the gate mask for the semiconductor device is deposited in a gas atmosphere of an ammonia gas and a silane gas such that a flow rate of the ammonia gas is set at twenty times or more than the flow rate of the silane gas. That is, a nitride layer is deposited by using a feed gas which contains less hydrogen, thereby the amount of hydrogen atoms remaining in the nitride layer can be reduced.

5. BRIEF DESCRIPTION OF THE DRAWINGS

6. DETAILED DESCRIPTION OF THE INVENTION

Figure 1A:
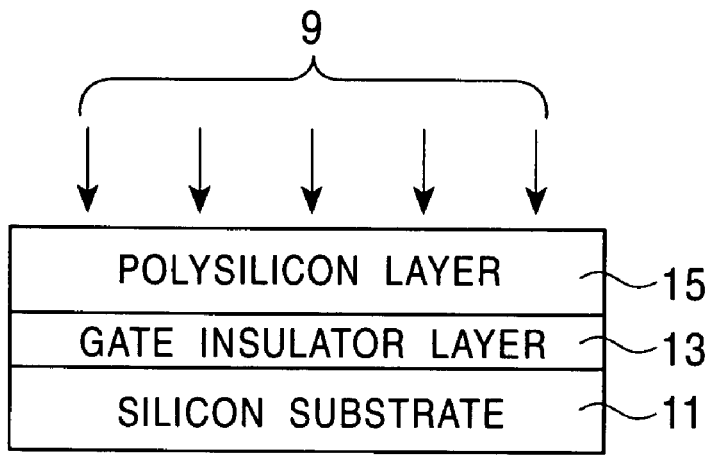
FIGS. 1A-1D are process drawings showing a fabrication method in the first embodiment.

Embodiments of the present invention will be described hereinafter with reference to the drawings. It should be noted that each of FIGS. 1A-1D and 3A-3D shows device structures obtained at each step of the fabrication process for a gate mask used for forming a gate electrode of the semiconductor device. It should be also noted that configuration, size and arrangement of each component shown in FIGS. 1A-1D and FIGS. 3A-3D are schematically illustrated to the extent necessary for understanding of the present invention. The same reference numeral designates the same component within each drawing in order to omit the description.

In the following embodiments, the nitride layer is formed by using an ammonia gas and a silane gas. The ammonia gas is used because the ammonia gas has the properties of decomposing easily, ease of use, readily reacting and a higher deposition rate in depositing the nitride layer. As a result, it is not necessary to generate plasma in depositing the nitride layer, thereby the semiconductor device can be fabricated by simple facilities.

FIGS. 1A-1D are process drawings showing a fabrication method in a first embodiment. In the first embodiment, a process temperature of the nitride layer deposition is set at a temperature that releases hydrogen from the nitride layer, when the nitride layer is selected as the gate mask used for forming the gate electrode of the semiconductor device. Specifically, the nitride layer is deposited at a temperature which allows releasing hydrogen from the nitride layer. Consequently, the hydrogen atoms can be released from the nitride layer into a gas atmosphere, thereby the amount of hydrogen atoms remaining in the nitride layer can be reduced. A detailed description will be made hereinafter. It should be noted that a gate electrode will be sometimes referred to as a gate simply in the following description.

A temperature for releasing hydrogen from the nitride layer should be maintained at least more than 750 deg. C., preferably 800 deg. C. or more, and more preferably about 830 deg. C. or more, so that a nitride layer 19 can be provided. It should be noted that the fabrication unit of the semiconductor device disclosed in Japanese Patent Laid-open No. 5-29301 cited above requires a mechanism to generate plasma, whereas the fabrication unit of the semiconductor device in the first embodiment does not require any mechanism to generate plasma. Therefore, the fabrication unit of the semiconductor device in the first embodiment permits simplification of the fabrication unit as compared with the fabrication unit of the semiconductor device disclosed in Japanese Patent Laid-open No. 5-29301.

Firstly, a gate insulator layer 13 is deposited on a silicon substrate 11 as shown in FIG. 1A, thereafter, a polysilicon layer or an amorphous silicon layer is deposited thereon. Description is herein after made based on an assumption that a polysilicon layer 15 is employed.

Next, a PMOS section and an NMOS section are formed on the polysilicon layer 15 by the following procedure which is shown as an example. As mentioned above, it is an object of the present invention to solve the problem which arises when a PMOS section is doped with Group III impurities such as boron. A region used for the NMOS section will not be shown therefore, and a part of a region used for the PMOS section will be shown in FIG. 1A-1D. Also, the following description will focus on the region used for the PMOS section, and the region used for the NMOS section will be briefly described.

A mask is firstly formed by a photoresist material on the polysilicon layer to cover a region which is not used for the PMOS section, so that a region used for the PMOS section is exposed. It should be noted that only a part of the region used for the PMOS section is shown in FIG. 1, and the region which is not used for the PMOS section is not shown in FIGS. 1A-1D which is assumed to extend beyond the limit of graphical frame of FIGS. 1A-1D. Then, such exposed region designated by an arrow 9 in FIG. 1A, i.e. the region used for the PMOS section, is doped with Group III impurities by means of ion implantation. The mask is then removed. Accordingly, the PMOS section is formed on the polysilicon layer.

Another mask is then formed by photoresist material on the polysilicon layer to cover a region which is not used for the NMOS section, so that a region used for the NMOS section is exposed. Then, such an exposed region, i.e. the region used for the NMOS section, is doped with Group V impurities such as phosphorus by means of ion implantation. The mask is then removed. Accordingly, the NMOS section is formed on the polysilicon layer. It should be noted that a forming sequence of the PMOS section and the NMOS section is arbitrarily determined depending on the structure of the semiconductor device.

A heat treatment is then applied to activate the impurity ions. An oxide film which is formed over the polysilicon layer 15 during the heat treatment, is to be removed.

A deposition process of the nitride layer used for a gate mask will be described hereinafter with reference to FIG. 1B. It should be noted that a region 15A shown in FIG. 1B denotes a region having been doped with impurities. The region 15A will be used for the PMOS section since the region is doped with Group III impurities.

Figure 1B:
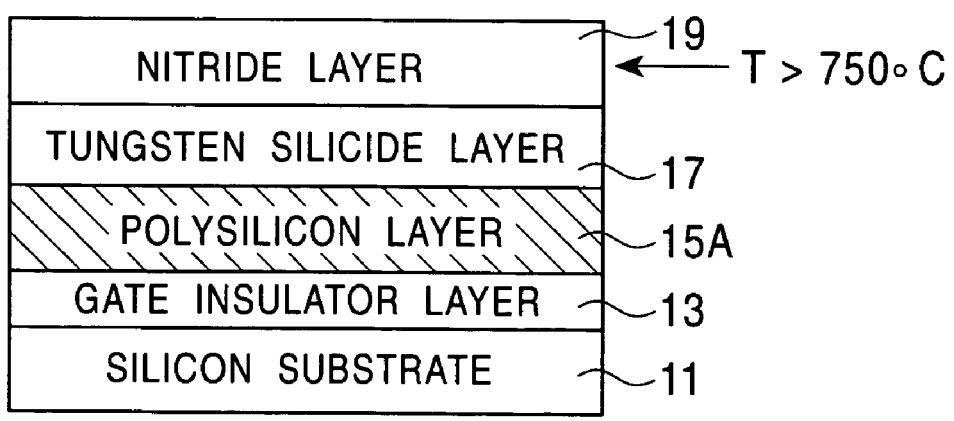

When necessary, a layer such as a tungsten silicide (WSix) layer 17 is deposited on the polysilicon layer 15A where impurities have already been doped as shown in FIG. 1B. Thereafter, a nitride layer 19 used for a gate mask is deposited thereon by means of a depressurized Chemical Vapor Deposition (CVD) method using an ammonia gas ($NH_3$) and a silane gas such as a dichlorosilane (DCS: $SiH_2Cl_2$) gas.

Pressure of a deposition gas atmosphere in a deposition chamber during the above deposition process should be preferably maintained within a range of 0.2-0.4 torr. Moreover, under the aforementioned pressure condition, a process temperature for the deposition of the nitride layer 19 is set at the temperature which allows releasing hydrogen from the nitride layer 19 as described above. Specifically, the temperature should be maintained at least 750 deg. C. or more, preferably 800 deg. C. or more, and more preferably about 830 deg. C. or more, maintaining such process temperature allows release of the hydrogen atoms from the nitride layer 19 into the gas atmosphere. As a result, the amount of Si—H bonds in the nitride layer 19 can be reduced.

Figure 2:
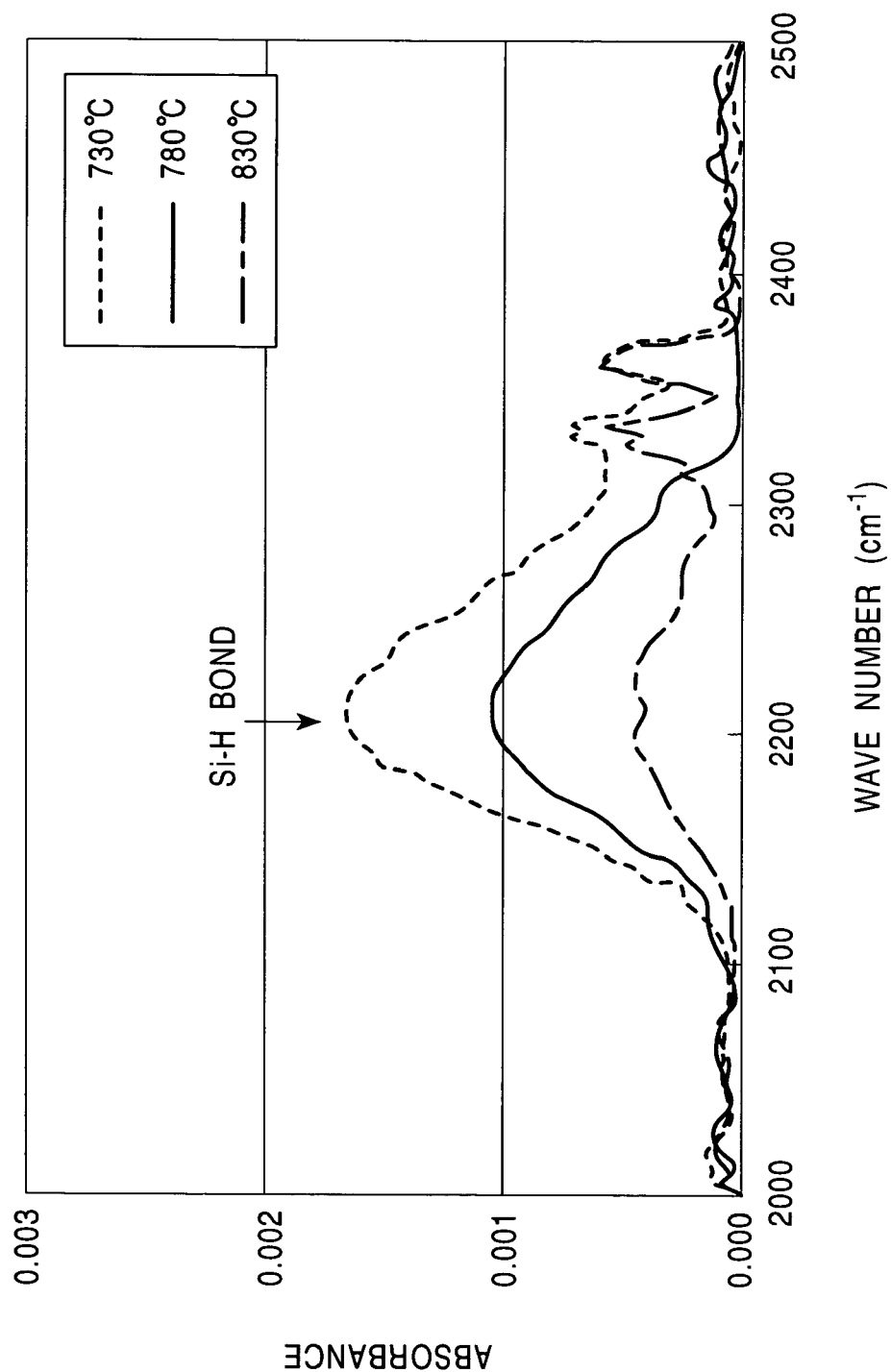
FIG. 2 is a graph showing a bonding state of hydrogen.

FIG. 2 is a graph showing a relationship between the process temperature for the deposition of the nitride layer 19 and hydrogen. The graph in FIG. 2 is showing a bonding state of hydrogen and Si in the nitride layer 19. An abscissa axis and an ordinate axis shown in FIG. 2 show a wave number in $cm^{-1}$ and light absorbance, respectively. It should be noted that the absorbance is nondimensional since it is a relatively defined coefficient. As can be seen in FIG. 2, as the absorbance value in the ordinate axis decrease, the number of bonds between hydrogen and Si in the nitride layer 19 decrease. This means a concentration of the hydrogen is reduced.

In FIG. 2, a dot line, a solid line and a dashed line show bonding states between hydrogen and Si, which were measured in the nitride layer 19 deposited at process temperatures of 730, 780 and 830 deg. C., respectively. It should be noted that a dichlorosilane gas was used as a silane gas for the deposition, and that a flow rate ratio of the ammonia gas to the dichlorosilane gas was 10:1. Moreover, an atmospheric pressure of a deposition gas in a deposition chamber was 0.15 torr. As can be seen in FIG. 2, all plots representing the deposition temperature at 730, 780 and 830 deg. C. exhibit a trend, that is, the absorbance rises abruptly at an area where the wave number exceeds 2120 $cm^{-1}$, the absorbance reaches its peak around the area where the wave number is 2210 $cm^{-1}$, and the absorbance abruptly decreases therefrom until the wave number reaches around 2290 $cm^{-1}$. It can also be seen in FIG. 2 that peak values of the absorbance were around 0.00170 and around 0.00105 when the process temperatures during the deposition of the nitride layer 19 were at 730 and 780 deg. C., respectively, which however decreases to around 0.00040 when the temperature was 830 deg. C.

According to the measurement result shown in FIG. 2, the respective rising gradients are $(0.00170-0.00020)/(2210-2120)=1.67\times10^{-5}$, $(0.00105-0.00015)/(2210-2120)=1.0\times10^{-5}$, and $(0.00040-0.00005)/(2210-2120)=0.39\times10^{-5}$ when the corresponding process temperatures are 730, 780 and 830 deg. C., respectively, within a wave number range between 2120 $cm^{-1}$ and 2210 $cm^{-1}$. Whereas, the respective falling gradients are $(0.00075-0.00170)/(2290-2210)-1.19\times10^{-5}$, $(0.00040-0.00105)/(2290-2210)=-0.81\times10^{-5}$, and $(0.00015-0.00040)/(2290-2210)=-0.31\times10^{-5}$ when the corresponding process temperatures are 730, 780 and 830 deg. C., respectively, within a wave number range between 2210 $cm^{-1}$ and 2290 $cm^{-1}$. These results show that fewer amounts of hydrogen atoms remain in the nitride layer when the rising gradients and the falling gradient become moderate. The moderate rising gradient and falling gradient demonstrate therefore an improved reliability of the semiconductor device, which is a preferable result.

As described above, it can be understood from the measurement result in FIG. 2 that the number of Si—H bonds in the nitride layer 19 can be reduced by virtue of releasing the hydrogen atoms from the nitride layer 19 which can be achieved by increasing the process temperature, preferably by maintaining the temperature of around 830 deg. C. or more. Consequently, the nitride layer 19 fabricated at the high process temperature provides a layer with a reduced content of the hydrogen compound and with a high purity of $Si_3N_4$.

Figure 1C:
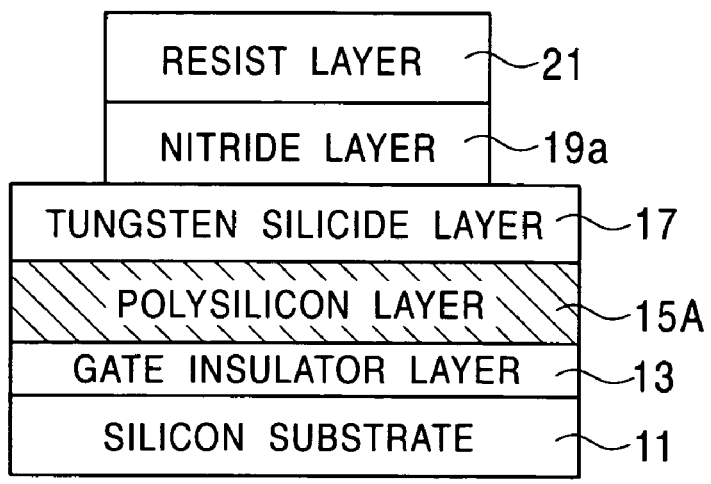

A patterning process of the gate mask will be described hereinafter with reference to the FIG. 1C. A resist layer 21 is formed on the nitride layer 19 by means of a photo-etching technique so as to be fabricated into an arbitrary pattern as shown in FIG. 1C. Thereafter, the patterning is carried out on the nitride layer 19 as a priming layer so as to form the nitride layer 19a as a gate mask. The resist layer 21 is then removed, thereby keeping the nitride layer 19a as the gate mask.

Figure 1D:
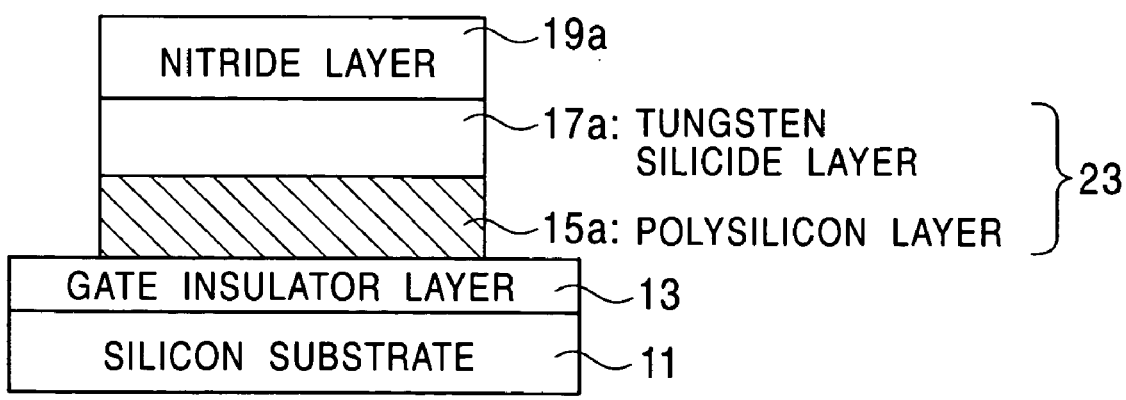

A patterning process of the gate electrode will be described hereinafter with reference to the FIG. 1D. A region of the tungsten silicide layer 17 and the polysilicon layer 15A which is not covered by the nitride layer 19a as the gate mask are removed by means of etching as shown in FIG. 1D.

As a result, a gate electrode 23 is formed as a multi layer body, having the tungsten silicide layer 17a and the polysilicon layer 15a, both of which are fabricated in an arbitrary pattern.

As described above, in the first embodiment, the hydrogen atoms that were combined or may be combined in the nitride layer during the deposition of the nitride layer can be released into the gas atmosphere, by depositing the nitride layer at a high temperature so as to release the hydrogen from the nitride layer. Accordingly, the amount of hydrogen in the nitride layer can be reduced. As a result, semiconductor devices having constant threshold voltages Vt with respect to each device can be provided.

In the first embodiment, an ammonia gas is used as one of the feed gases for the deposition of the nitride layer. As described above, the ammonia gas has properties of decomposing easily, ease of use, readily reacting and a higher deposition rate in depositing the nitride layer. As a result, it is not necessary to generate plasma in depositing the nitride layer according the first embodiment, thereby the semiconductor device can be fabricated by simple facilities.

In addition to using the ammonia gas having a higher deposition rate, a process temperature for the deposition of the nitride layer is set at a high temperature in the first embodiment. As a result, the nitride layer can be deposited at a higher rate in the first embodiment, thereby the semiconductor device can be fabricated within a short period.

FIGS. 3A-3D are process drawings showing a fabrication method in a second embodiment. In the second embodiment, an ammonia gas and a silane gas are selected as feed gases for forming the nitride layer, and furthermore, the flow rate of the ammonia gas is set at twenty times or higher as compared to the silane gas, when the nitride layer is selected as the gate mask used for forming the gate electrode of the semiconductor device. A detailed description will be made hereinafter. It should be noted that since the nitride layer 19 exhibits the following measurement results, the flow rate of the ammonia gas is set at twenty times or greater than the flow rate of the silane gas.

Each step in a fabrication procedure in the second embodiment is substantially similar to that of the first embodiment.

Figure 3A:
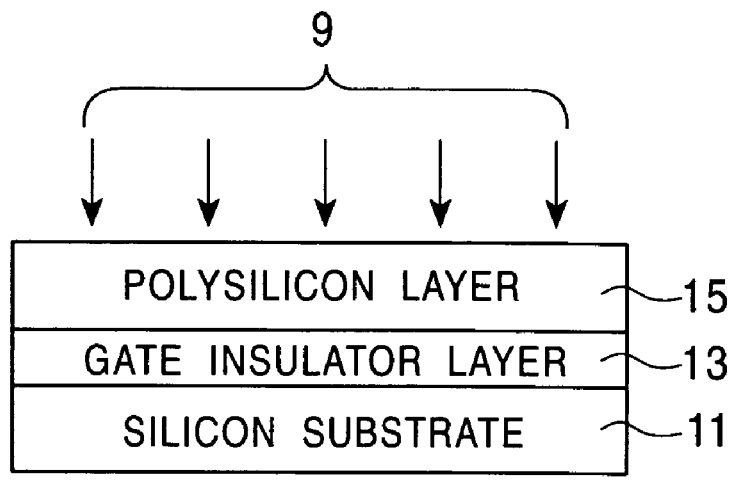
FIGS. 3A-3D are process drawings showing a fabrication method in the second embodiment.

Firstly, a gate insulator layer 13 is deposited on a silicon substrate 11 as shown in FIG. 3A, and a polysilicon layer or an amorphous silicon layer is deposited thereon. Description is hereinafter made based on an assumption that the polysilicon layer 15 is employed.

Next, a PMOS section and an NMOS section are formed on the polysilicon layer 15 by the following procedure which is shown as an example. It is an object of the present invention to solve a problem which arises when a PMOS section is doped with Group III impurities such as boron. A region used for the NMOS section will not be shown therefore, and only a part of a region used for the PMOS section will be illustrated in FIG. 3. Also, the following description will focus on the region used for the PMOS section, and the region used for the NMOS section will be briefly described.

A mask is firstly formed by photoresist material on the polysilicon layer to cover a region which is not used for the PMOS section, so that a region used for the PMOS section is exposed. It should be noted that only a part of the region used for the PMOS section is shown in FIGS. 3A-3D, and an unused region for the PMOS section is not shown in FIGS. 3A-3D which is assumed to extend beyond the limit of the graphical frame of the FIG. 3. Then, such exposed region designated by an arrow 9 in FIG. 3A, i.e. the region used for the PMOS section, is doped with Group III impurities such as boron by means of ion implantation. The mask is then removed. Accordingly, the PMOS section is formed on the polysilicon layer.

Another mask is then formed by photoresist material on the polysilicon layer to cover a region which is not used for the NMOS section, so that a region used for the NMOS section is exposed. Then, such an exposed region, i.e. the region used for the NMOS section, is doped with Group V impurities such as phosphorus by means of ion implantation. The mask is then removed. Accordingly, the NMOS section is formed on the polysilicon layer. It should be noted that a forming sequence of the PMOS section and the NMOS section is arbitrarily determined depending on the structure of the semiconductor device.

A heat treatment is then applied in order to activate impurity ions which have been doped. An oxide film which is formed over the polysilicon layer 15 during the heat treatment, is removed.

A deposition process of the nitride layer used for a gate mask will be described hereinafter with reference to the FIG. 3B. It should be noted that a region 15A shown in FIG. 3B denotes a doped region with impurities. The region 15A will be used for the PMOS section since the region is doped with Group III impurities.

Figure 3B:
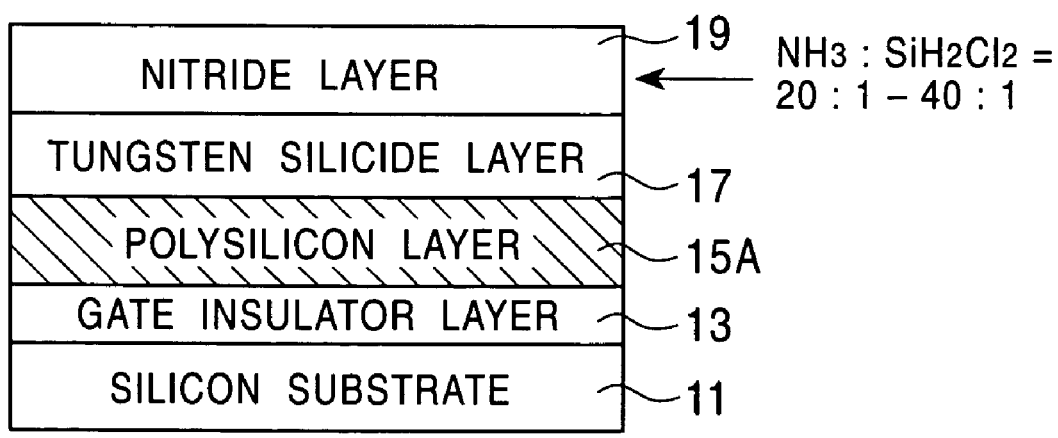

When necessary, a layer such as tungsten silicide (WSix) layer 17 is deposited on the polysilicon layer 15A where impurities have already been doped as shown in FIG. 3B. Thereafter, a nitride layer 19 used for a gate mask is deposited thereon by means of a depressurized Chemical Vapor Deposition (VCD) method using an ammonia gas ($NH_3$) and a silane gas such as a dichlorosilane (DCS: $SiH_2Cl_2$) gas.

During the deposition, a flow rate ratio within a deposition gas atmosphere in a deposition chamber should be set such that the flow rate of the ammonia gas is set at twenty times or larger than the flow rate of the silane gas, preferably the flow rate ratio of the ammonia gas to the silane gas is set within a range of 20:1-40:1. That is, the nitride layer is deposited by using a feed gas that has properties which can react readily, and provide higher deposition rate of the nitride layer. Consequently, the amount of hydrogen remaining in the nitride layer can be reduced.

Figure 4:
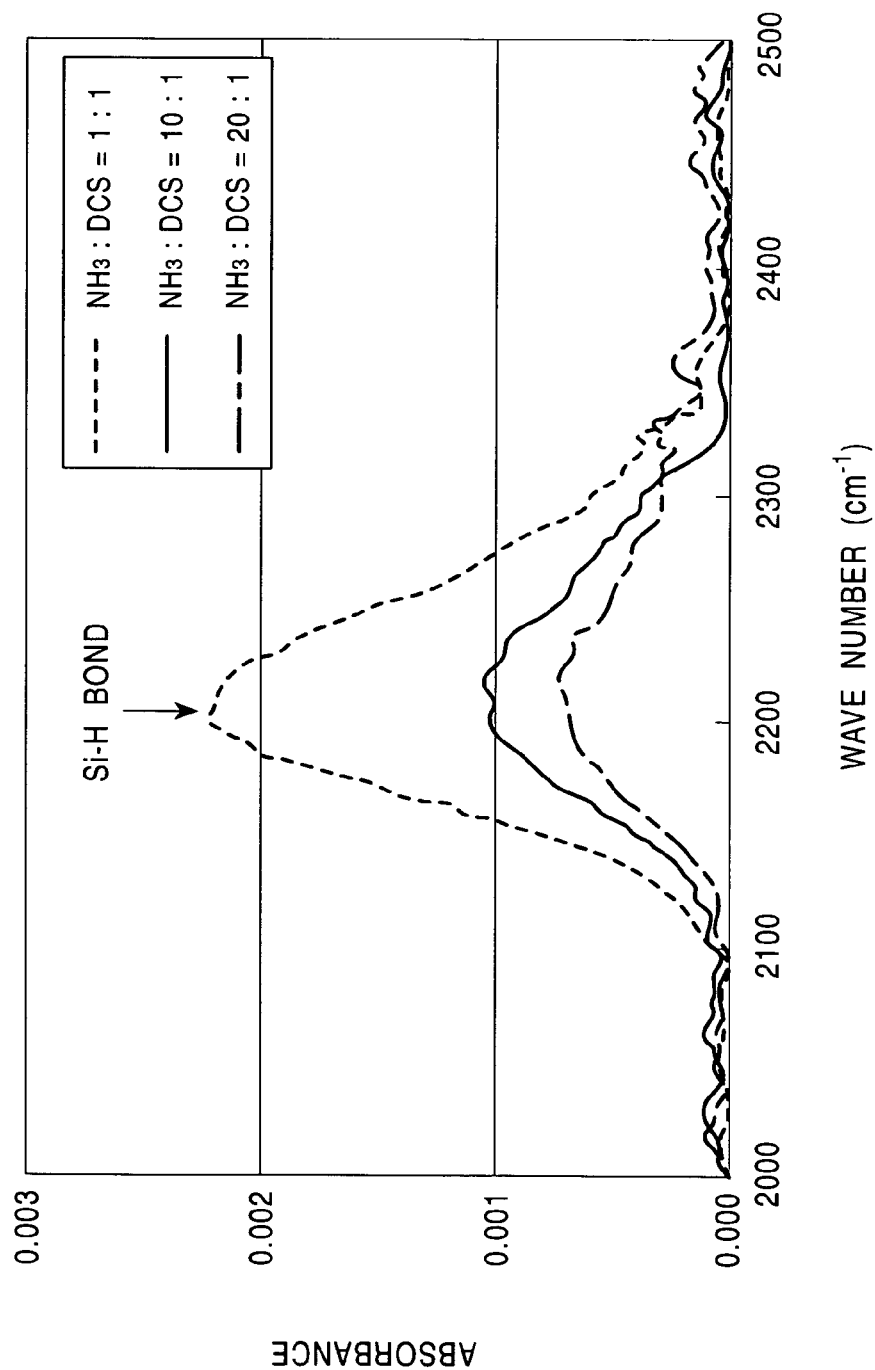
FIG. 4 is a graph showing a bonding state of hydrogen.

FIG. 4 is a plot showing a relationship between the process temperature for the deposition of the nitride layer 19 and hydrogen. FIG. 4 is a graph showing a bonding state of hydrogen and Si in the nitride layer 19. An abscissa axis and an ordinate axis of FIG. 4 show a wave number in $cm^{-1}$ and an light absorbance, respectively. It should be noted that the absorbance is nondimensional since it is a coefficient to be defined relatively. As can be seen in FIG. 4, as the absorbance value in the ordinate axis decreases, the number of bonds between hydrogen and Si in the nitride layer 19 decreases. This means a concentration of the hydrogen is reduced.

In FIG. 4, a dot line, a solid line and a dashed line exhibit results of bonding state between hydrogen and Si, which were measured in the nitride layer 19 deposited with the flow rate ratio of the ammonia gas to the dichlorosilane (DCS) gas at 1:1, 10:1 and 20:1, respectively. It should be noted that the process temperature for the deposition of the nitride layer was set at 780 deg. C., and an atmospheric pressure of a deposition gas in a deposition chamber was 0.15 torr. As can be seen in FIG. 4, a plot representing the flow rate ratio of the ammonia gas to the dichlorosilane (DCS) gas at a 1:1 ratio exhibits a trend, that is, the absorbance rises abruptly at an area where the wave number exceeds 2120 $cm^{-1}$, the absorbance reaches its peak around the area where the wave number is 2205 $cm^{-1}$, and the absorbance abruptly decrease therefrom until the wave number reaches around 2290 $cm^{-1}$. Whereas, the plot representing the flow rate ratio of the ammonia gas to the dichlorosilane (DCS) gas at 10:1 and 20:1 exhibit another trend, that is, the absorbance rises abruptly at an area where the wave number exceeds 2120 $cm^{-1}$, the absorbance reaches its peak around the area where the wave number is 2220 $cm^{-1}$, and the absorbance abruptly decreases therefrom until the wave number reaches around 2290 $cm^{-1}$. It can be also seen in FIG. 4 that peak values of the absorbance were around 0.00230 and around 0.00105 when the flow rate ratio of the ammonia gas to the dichlorosilane (DCS) were at 1:1 and 10:1, respectively, which however decreases to around 0.00075 when the ratio was 20:1

According to the measurement result shown in FIG. 4, the rising gradient is within a wave number range between 2120 $cm^{-1}$ and 2205 $cm^{-1}$ when the flow rate ratio of the ammonia gas to the dichlorosilane (DCS) is at 1:1. Whereas the rising gradients are within a wave number range between 2120 $cm^{-1}$ and 2220 $cm^{-1}$ when the flow rate ratios of the ammonia gas to the dichlorosilane (DCS) are at 10:1 and 20:1. The respective rising gradients are $(0.00230-0.00025)/(2205-2120)=2.41\times10^{-5}$, $(0.00105-0.00015)/(2220-2120)=0.90\times$ $10^{-5}$, and $(0.00075-0.00005)/(2220-2120)=0.70\times10^{-5}$ when the corresponding flow rate ratios of the ammonia gas to the dichlorosilane (DCS) were 1:1, 10:1 and 20:1, respectively. Whereas, the respective falling gradients are $(0.00070-0.00230)/(2290-2205)=-1.88\times10^{-5}$, $(0.00045-0.00105)/(2290-2220)=-0.86\times10^{-5}$, and $(0.00030-0.00075)/(2290-2220)=-0.64\times10^{-5}$ when the corresponding flow rate ratio of the ammonia gas to the dichlorosilane (DCS) were 1:1, 10:1 and 20:1, respectively. These results show that smaller amounts of hydrogen atoms remain in the nitride layer when the rising gradient and the falling gradient is moderate. The moderate rising gradient and falling gradient therefore demonstrate an improved reliability of the semiconductor device, which is a preferable result.

As described above, it can be understood from the result shown in FIG. 4 that the number of Si—H bonds in the nitride layer 19 can be reduced when the flow rate of the ammonia gas is larger than the flow rate of the silane gas, preferably the flow rate of the ammonia gas is twenty times or larger than the flow rate of the silane gas. Consequently, the nitride layer 19 fabricated under the condition that the flow rate of the ammonia gas is larger than the flow rate of the silane gas provides the layer with a greatly decreased hydrogen compound content and with a high purity of $Si_3N_4$. It should be noted that the ratio of 40:1 which is an upper limit of the flow rate ratio mentioned above designates the upper limit of fabrication units available in the market. The ratio can vary depending on the capacity of the fabrication unit.

Figure 5:
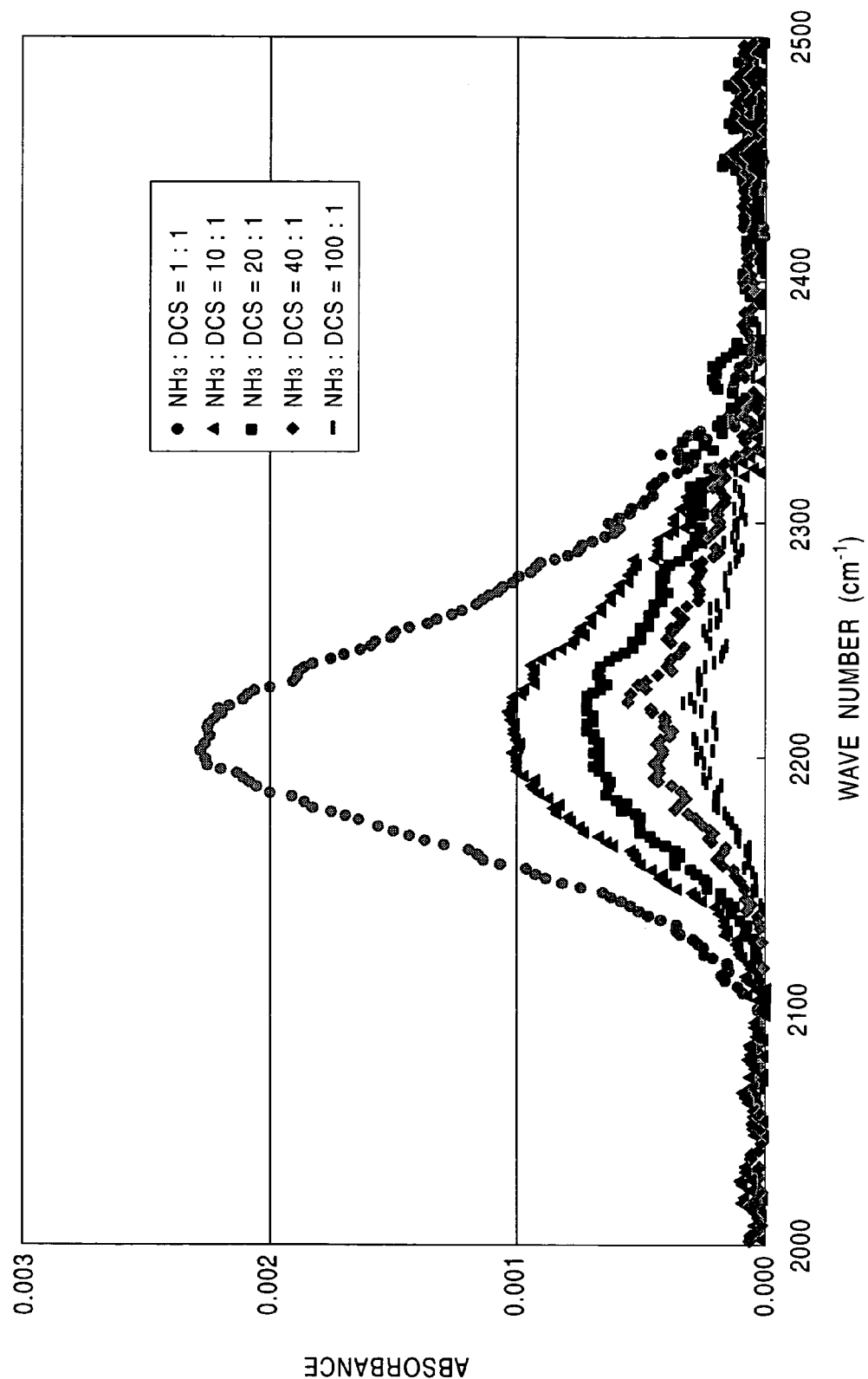
FIG. 5 is a graph showing a absorbance of lights in the cases where the flow rate ratio is changed.

Alternatively, during the formation of a nitride layer, the flow rate of the ammonia-based gas is from twenty to one hundred times the flow rate of the silane-based gas. Referring to FIG. 5, an absorbance or an amount of absorption absorption is shown in several cases where the flow rates of the ammonia gas are set at 1, 10, 20, 40 or 100 times the flow rate of the silane-based gas respectively. The term absorbance denotes a measure of how much the light of a certain wavenumber, radiated onto a wafer with a formed nitride layer, is absorbed. It should be noted that the absorbance is nondimensional since it is a relatively defined coefficient. The fact that the absorbance value decreases means the number of Si—H bonds in the nitride layer further decreases.

As shown in FIG. 5, it can be seen that the absorbance decreases as the ratio of the flow rate of the ammonia gas to the flow rate of the silane-based gas increases. Now we will analyze the result shown in FIG. 5. When the flow rates of the ammonia gas are especially 40 or 100 times the flow rate of the silane-based gas during the formation of a nitride layer, the maximal values of the absorbance for each case are approximately 0.0005 or 0.0003 respectively. Additionally, when the flow rate ratios are especially 40 or 100, the gradients of plot lines for each flow rate ratio in FIG. 5 are approximately 7.14E-06 or 4.30E-06 respectively. The gradients of those plot lines show that the absorbance decreases as the flow rate ratio increases. Thus, we can recognize that the number of Si—H bonds in the nitride layer decreases as the flow rate ratio of the ammonia gas to the silane-based gas increases. Therefore, the amount of the hydrogen existing in the nitride layer can be reduced.

Figure 3C:
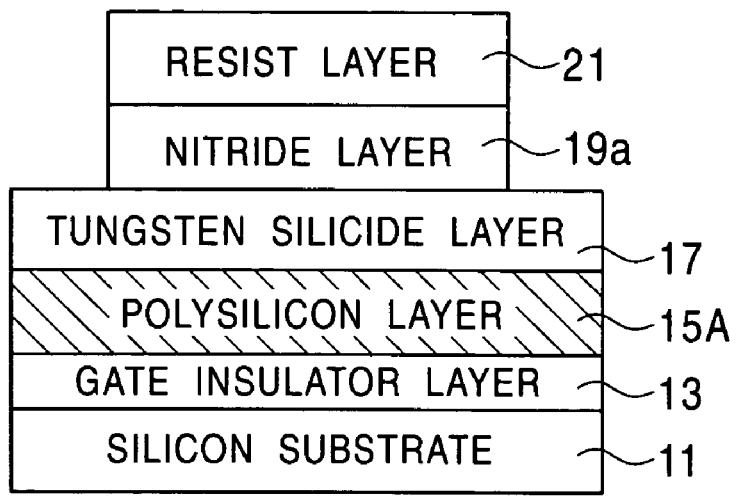

A patterning process of the gate mask will be described hereinafter with reference to the FIG. 3C. A resist layer 21 is formed on the nitride layer 19 by means of a photo-etching technique so as to be fabricated in an arbitrary pattern as shown in FIG. 3C. Thereafter, the patterning is carried out on the nitride layer 19 as a priming layer so as to form the nitride layer 19a as a gate mask. The resist layer 21 is then removed, thereby keeping the nitride layer 19a as the gate mask.

Figure 3D:
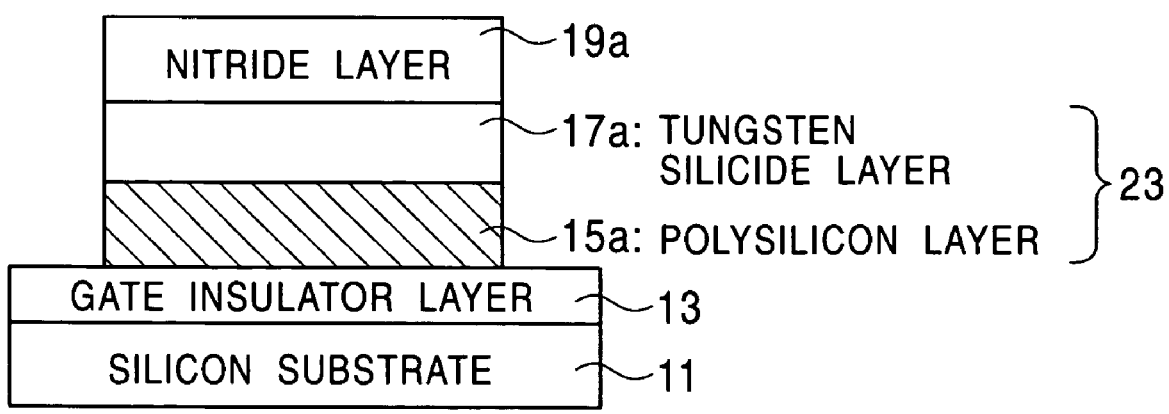

A patterning process of the gate electrode will be described hereinafter with reference to the FIG. 3D. A region of the tungsten silicide layer 17 and the polysilicon layer 15 which are not covered by the nitride layer 19a as the gate mask are removed by etching as shown in FIG. 3D.

As a result, a gate electrode 23 is formed as a multi layer body, comprising the tungsten silicide layer 17a fabricated in an arbitrary pattern and the polysilicon layer 15a fabricated in an arbitrary pattern.

As described above, in the second embodiment, the amount of the hydrogen atoms that will be combined with the dangling bonds of the nitrogen atoms and silicon atoms can be suppressed, by setting the flow rate of the ammonia gas at twenty times or more than that of the silane gas during the deposition of the nitride layer. As a result, the semiconductor devices having constant threshold voltages Vt with respect to each device can be provided in fabrication of the semiconductor devices.

In the second embodiment, an ammonia gas is used as one of the feed gases for the deposition of the nitride layer similar to the first embodiment. As described above, the ammonia gas has properties of decomposing easily, ease of use, readily reacting and a higher deposition rate in depositing the nitride layer. As a result, it is not necessary to generate plasma in depositing the nitride layer according the second embodiment, thereby the semiconductor device can be fabricated by simple facilities.

In addition to using the ammonia gas having a higher deposition rate, a process temperature for the deposition of the nitride layer is set at a high temperature in the second embodiment similar to the first embodiment. As a result, the nitride layer can be deposited at a higher rate in the second embodiment, thereby the semiconductor device can be fabricated within a short period.

Moreover, it is not necessary to use a high process temperature when depositing the nitride layer in the second embodiment. Accordingly, the spreading of impurities such as boron and phosphorus in such a diffusion layer can be suppressed to a significant extent as compared with the first embodiment.

It should be noted that the aforementioned description has been made based on the assumption that the polysilicon layer is doped with impurities, however, a similar description can be made when an amorphous silicon layer is doped with impurities.

The present invention described above has an effect of to providing semiconductor devices having a constant threshold voltages Vt with respect to each device in fabrication of the semiconductor devices.

What is claimed:

1. A method for fabricating a semiconductor device, comprising:
   providing a silicon substrate;
   forming an insulator layer on a surface of the silicon substrate;
   forming a polysilicon layer on a surface of the insulator layer;
   forming a tungsten silicide layer on a surface of the polysilicon layer;
   forming a nitride layer on a surface of the tungsten silicide layer;
   forming a resist pattern on a surface of the nitride layer;
   patterning the nitride layer by using the resist pattern as a mask; and patterning the tungsten silicide layer and the polysilicon layer by using the nitride layer as a mask to form a gate electrode, wherein the nitride layer is deposited in a gas atmosphere of an ammonia gas and a dichlorosilane gas, a flow rate of said ammonia gas being at least twenty times a flow rate of the dichlorosilane gas.

2. A method for fabricating a semiconductor device, comprising:

providing a silicon substrate;

forming an insulator layer on a surface of the silicon substrate;

forming a polysilicon layer on a surface of the insulator layer;

forming a tungsten silicide layer on a surface of the polysilicon layer;

forming a nitride layer on a surface of the tungsten silicide layer;

forming a resist pattern on a surface of the nitride layer;

patterning the nitride layer by using the resist pattern as a mask; and patterning the tungsten silicide layer and the polysilicon layer by using the nitride layer as a mask to form a gate electrode, wherein the nitride layer is deposited in a gas atmosphere of an ammonia gas and a dichlorosilane gas, a flow rate of said ammonia gas being from twenty to one hundred times a flow rate of the dichlorosilane gas.

* * * * *